(12) United States Patent
Fujita et al.

(10) Patent No.: US 10,643,835 B2
(45) Date of Patent: May 5, 2020

(54) SUBSTRATE PROCESSING APPARATUS, LIQUID PROCESSING METHOD, AND STORAGE MEDIUM

(71) Applicant: Tokyo Electron Limited, Tokyo (JP)

(72) Inventors: Akira Fujita, Kumamoto (JP); Tsuyoshi Mizuno, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 163 days.

(21) Appl. No.: 15/464,679

(22) Filed: Mar. 21, 2017

(65) Prior Publication Data
US 2017/0287699 A1    Oct. 5, 2017

(30) Foreign Application Priority Data

Mar. 30, 2016    (JP) .................................. 2016-068550

(51) Int. Cl.
*H01L 21/02* (2006.01)
*B08B 3/02* (2006.01)
(Continued)

(52) U.S. Cl.
CPC .......... *H01L 21/02052* (2013.01); *B08B 3/02* (2013.01); *B08B 3/041* (2013.01); *B08B 3/08* (2013.01); *C23F 1/02* (2013.01); *C23F 1/08* (2013.01); *C23F 1/16* (2013.01); *C23F 1/32* (2013.01); *G03F 7/168* (2013.01);
(Continued)

(58) Field of Classification Search
CPC ................................ H01L 22/12; H01L 22/20
See application file for complete search history.

(56) References Cited

U.S. PATENT DOCUMENTS 5,608,943 A * 3/1997 Konishi ................. B08B 3/022
                                                   118/50
2004/0260420 A1* 12/2004 Ohno .................... G01N 21/211
                                                   700/121
(Continued)

FOREIGN PATENT DOCUMENTS

JP    06-250380 A    9/1994
JP    2002-064057 A  2/2002
(Continued)

Primary Examiner — Mikhail Kornakov
Assistant Examiner — Natasha N Campbell
(74) Attorney, Agent, or Firm — Abelman, Frayne & Schwab

(57) ABSTRACT

Provided is a substrate processing apparatus that removes a film by supplying a processing liquid to the peripheral edge of a substrate. An ejection unit ejects the processing liquid to the peripheral edge of the substrate held and rotated by a substrate holding unit. An ejection position setting unit sets the ejection position of the processing liquid of the ejection unit to correspond to the removal width of the film included in a recipe, and a property information acquisition unit acquires property information of the film to be removed. A correction amount acquisition unit acquires the correction amount for correcting the ejection position of the processing liquid based on the property information of the film, and an ejection position correction unit corrects the ejection position of the processing liquid by the ejection unit based on the correction amount acquired by the correction amount acquisition unit.

18 Claims, 7 Drawing Sheets

(51) Int. Cl.
    *C23F 1/08*     (2006.01)
    *C23F 1/02*     (2006.01)
    *G03F 7/16*     (2006.01)
    *B08B 3/04*     (2006.01)
    *B08B 3/08*     (2006.01)
    *C23F 1/16*     (2006.01)
    *C23F 1/32*     (2006.01)
    *H01L 21/67*     (2006.01)
    *H01L 21/687*     (2006.01)
    *H01L 21/66*     (2006.01)

(52) U.S. Cl.
    CPC .. *H01L 21/67051* (2013.01); *H01L 21/67253* (2013.01); *H01L 21/68764* (2013.01); *H01L 22/20* (2013.01); *H01L 21/02087* (2013.01); *H01L 22/12* (2013.01)

(56) References Cited

U.S. PATENT DOCUMENTS

2010/0227046 A1*   9/2010   Kato .................... C23C 16/402
                                                                                                          427/10
2013/0206726 A1*   8/2013   Oono ................ H01L 21/67253
                                                                                                           216/85

FOREIGN PATENT DOCUMENTS

| JP | 2007-036180 A | 2/2007 |
| JP | 2008-177584 A | 7/2008 |
| JP | 2013-168429 A | 8/2013 |

\* cited by examiner

SUBSTRATE PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2016-068550, filed on Mar. 30, 2016, with the Japan Patent Office, the disclosure of which is incorporated herein in its entirety by reference.

TECHNICAL FIELD

The present disclosure relates to a technology to remove a film on the peripheral edge of a substrate.

BACKGROUND

For example, in a manufacturing process of a semiconductor device, in order to suppress the peeling of a film or the generation of particles due to, for example, a contact with other apparatuses, a processing of removing a film formed on the peripheral edge of a substrate may be performed.

As an example of a substrate processing apparatus that removes a film on the peripheral edge of a semiconductor wafer as a substrate (hereinafter, referred to as a "wafer"), there has been known a technology of removing, for example, a resist film or a metal film formed on the peripheral edge of the substrate, or an oxide film or an inorganic film formed on the surface of the metal film by supplying a processing liquid to the peripheral edge of the wafer while horizontally maintaining the wafer and rotating the wafer about a vertical axis.

For example, Japanese Patent Laid-Open Publication No. 2007-036180 (see, e.g., paragraphs [0001], [0026], [0029] and [0030], and FIG. 3) discloses a technology of removing a thin film, such as, for example, a metal layer or a photoresist layer formed on the peripheral edge of a substrate to an arbitrarily set removal width by supplying a chemical liquid, such as, for example, a chemical agent or an organic solvent, from a peripheral edge processing nozzle, which is disposed at the position facing the peripheral edge.

However, there are various types of films formed on the surface of a substrate, and a processing liquid to be adopted varies depending on the type of the film. In addition, the same type of films may have different physical properties pertaining to the ease of removal by the processing liquid, such as, for example, film hardness or film thickness. In these cases, even if the processing liquid is supplied to the same position on the substrate peripheral edge, the set removal width may not be obtained.

Japanese Patent Laid-Open Publication No. 2007-036180 does not focus on such a problem, and does not disclose a method for solving the problem.

SUMMARY

The present disclosure provides a substrate processing apparatus that removes a film on a peripheral edge of a substrate by supplying a processing liquid to the substrate. The substrate processing apparatus includes: a substrate holding unit configured to hold the substrate and including a rotation mechanism configured to rotate the substrate; an ejection unit configured to eject the processing liquid to the peripheral edge of the substrate held by the substrate holding unit; an ejection position setting unit configured to set an ejection position of the processing liquid to correspond to a removal width of the film included in an input recipe; a movement mechanism configured to move the ejection position of the processing liquid of the ejection unit toward a diametric direction of the substrate based on the ejection position set by the ejection position setting unit; a property information acquisition unit configured to acquire property information of the film to be removed; a correction amount acquisition unit configured to acquire a correction amount for correcting the ejection position set by the ejection position setting unit based on the property information of the film acquired by the property information acquisition unit; and an ejection position correction unit configured to correct the ejection position set by the ejection position setting unit, based on the correction amount acquired by the correction amount acquisition unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
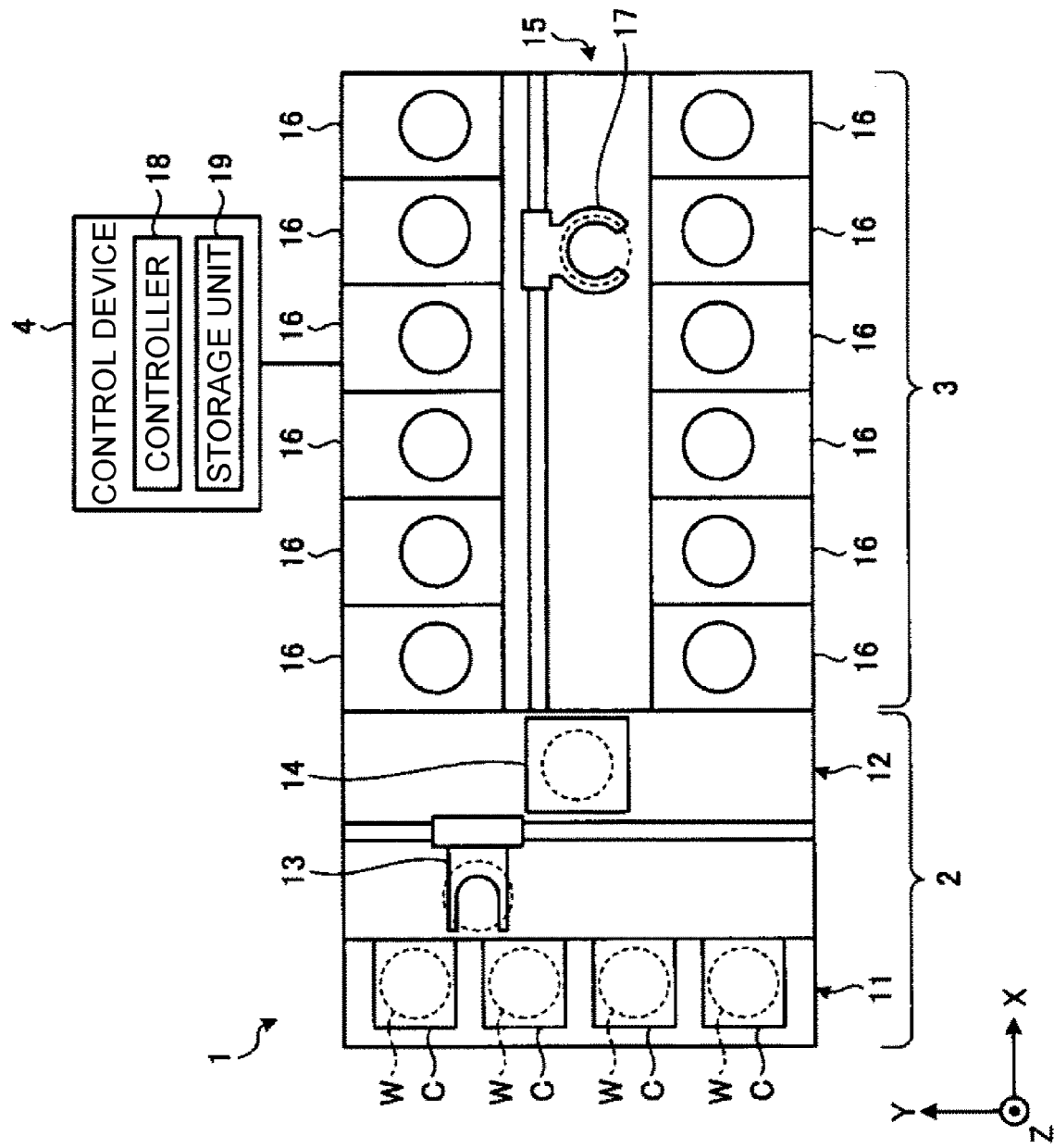
FIG. 1 is a plan view illustrating an outline of a substrate processing system provided with a processing unit according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made under such circumstances, and is to provide a substrate processing apparatus and a liquid processing method that are capable of reducing a variation in removal width due to a difference between the properties of films. Further, the present disclosure provides a storage medium that stores the liquid processing method.

According to an aspect of the present disclosure, there is provided a substrate processing apparatus that removes a film on a peripheral edge of a substrate by supplying a processing liquid to the substrate. The substrate processing apparatus includes: a substrate holding unit configured to hold the substrate and including a rotation mechanism configured to rotate the substrate; an ejection unit configured to eject the processing liquid to the peripheral edge of the substrate held by the substrate holding unit; an ejection position setting unit configured to set an ejection position of the processing liquid to correspond to a removal width of the film included in an input recipe; a movement mechanism configured to move the ejection position of the processing liquid of the ejection unit toward a diametric direction of the substrate based on the ejection position set by the ejection position setting unit; a property information acquisition unit configured to acquire property information of the film to be removed; a correction amount acquisition unit configured to acquire a correction amount for correcting the ejection position set by the ejection position setting unit based on the property information of the film acquired by the property information acquisition unit; and an ejection position correction unit configured to correct the ejection position set by the ejection position setting unit, based on the correction amount acquired by the correction amount acquisition unit.

In the above-described substrate processing apparatus, the property information of the film is type information of the film.

In the above-described substrate processing apparatus, the property information of the film is physical property information of the film.

In the above-described substrate processing apparatus, the physical property information of the film is a hardness or a film thickness of the film.

In the above-described substrate processing apparatus, the property information acquisition unit includes an analysis sensor, and acquires the property information based on a result of analyzing the film formed on the substrate by the analysis sensor.

In the above-described substrate processing apparatus, the substrate holding unit, the movement unit, and the analysis sensor are disposed in a common chamber.

In the above-described substrate processing apparatus, the property information acquisition unit acquires the property information via communication with an outside.

In the above-described substrate processing apparatus, the correction amount acquisition unit acquires at least one of a rotation number correction amount for correcting a rotation number per unit time of the substrate rotated by the rotation mechanism, and a correction flow rate for correcting a supply flow rate of the processing liquid ejected from the ejection unit, depending on the property information of the film acquired by the property information acquisition unit. The rotation mechanism corrects the rotation number of the substrate based on the rotation number correction amount, and the processing liquid supply unit corrects the supply flow rate of the processing liquid based on the correction flow rate.

According to another aspect of the present disclosure, there is provided a liquid processing method for removing a film on a peripheral edge of a substrate by supplying a processing liquid to the substrate. The liquid processing method includes: an ejection position setting process of setting an ejection position of the processing liquid of an ejection unit, which is disposed to face the peripheral edge of the substrate, to correspond to a removal width of the film included in a recipe; a property information acquisition process of acquiring property information of the film to be removed; a correction amount acquisition process of acquiring a correction amount for correcting the ejection position, which is set in the ejection position setting process, based on the property information of the film acquired in the property information acquisition process; an ejection position correction process of correcting the ejection position, which is set in the ejection position setting process, based on the correction amount acquired in the correction amount acquisition process; an ejection unit movement process of moving the ejection unit to an ejection execution position corrected in the ejection position correction process; and a removal process of removing the film on the peripheral edge by supplying the processing liquid to the peripheral edge of the substrate that is being rotated by ejecting the processing liquid from the ejection unit, which is moved to the ejection execution position.

In the above-described liquid processing method, the property information of the film is type information of the film.

In the above-described liquid processing method, the property information of the film is physical property information of the film.

In the above-described liquid processing method, the physical property information of the film is a hardness of the film or a film thickness.

In the above-described liquid processing method, in the property information acquisition process, the property information is acquired based on a result of analyzing the film formed on the substrate by an analysis sensor.

The above-described liquid processing method further includes at least one of a rotation number correction process of correcting a rotation number of the substrate in the removal process, and a flow rate correction process of correcting a supply flow rate of the processing liquid ejected from the ejection unit in the removal process, depending on the property information of the film acquired in the property information acquisition process.

There is also provided a non-transitory computer readable storage medium storing a computer program that, when executed, to cause a computer to control a substrate processing apparatus that removes a film on a peripheral edge of a substrate by supplying a processing liquid to the substrate. The computer program includes a group of steps that are programmed to execute the above-described liquid processing methods.

The present disclosure may reduce a variation in removal width due to differences between the properties of films.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Next, a configuration of the processing unit 16 provided in the substrate processing system 1 will be described with reference to FIGS. 2 to 4. The processing unit 16 corresponds to a substrate processing apparatus of the present exemplary embodiment, and performs a liquid processing of removing a film formed on the peripheral edge of the wafer W by supplying a processing liquid to the peripheral edge. The film to be removed may be, for example, a resist film, a metal film, or an oxide film or an inorganic film on the surface of the metal film.

Figure 2:
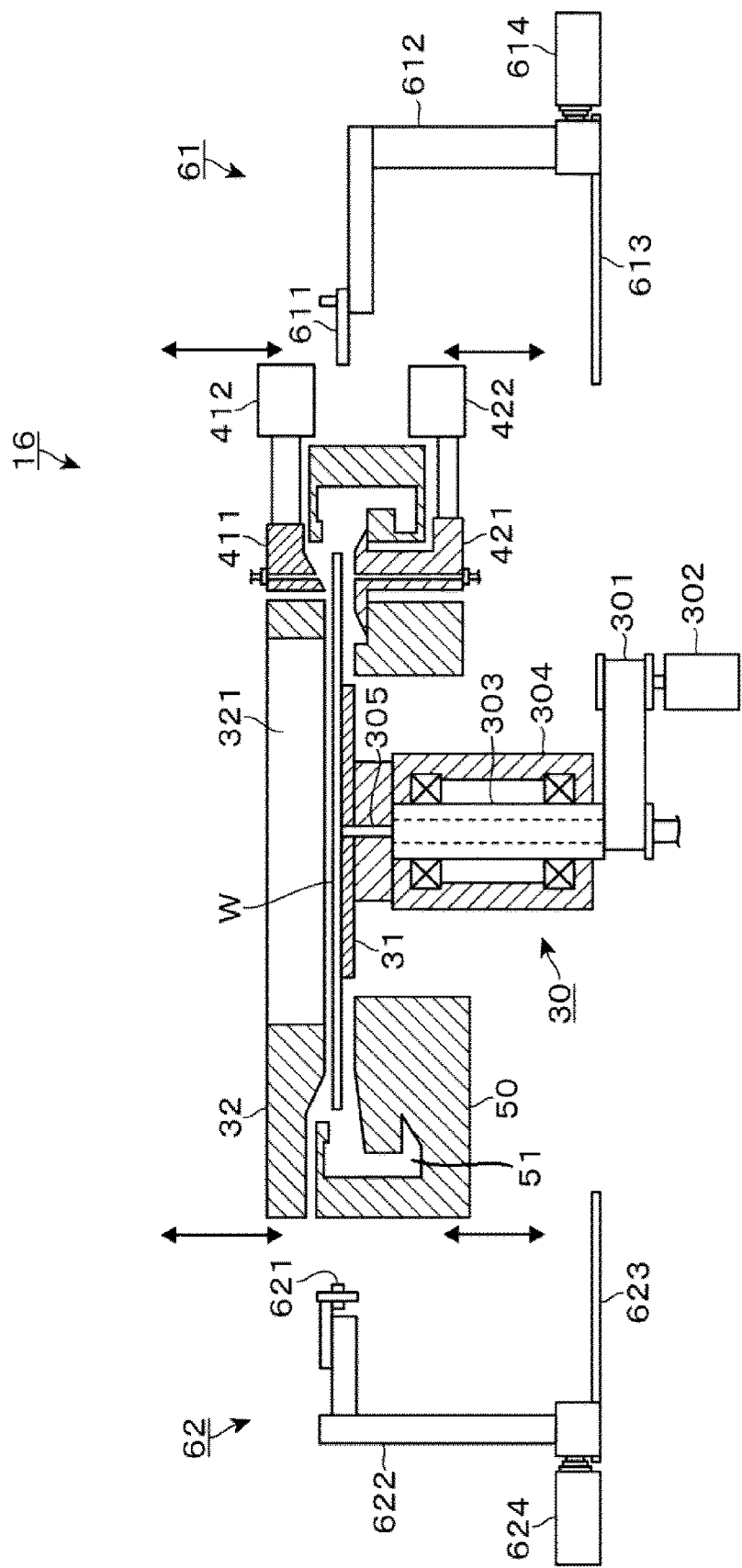
FIG. 2 is a vertical sectional side view of the processing unit.

As illustrated in FIG. 2, the processing unit 16 includes a wafer holding mechanism 30 configured to horizontally hold the wafer W and rotate the wafer W about a vertical axis, a cup unit 50 configured to receive a processing liquid, which is supplied to the wafer W that is being rotated, and shaken off to the periphery, and discharge the processing liquid to the outside, a top plate 32 configured to cover the top of the wafer W, and first and second nozzle units 411 and 421 configured to supply the processing liquid from the top side and the bottom side of the peripheral edge of the wafer W, respectively.

The wafer holding mechanism 30 is connected to a motor 302 via a power transmission unit 301 including, for example, a pulley and a belt, and has a configuration in which a disc-shaped holding unit (substrate holding unit) 31 is provided on the upper end of a rotating shaft 303 retained in a bearing 304 to be rotatable around a vertically extending rotation center. The rotating shaft 303, the bearing 304, the power transmission unit 301, and the motor 302 correspond to a rotation mechanism that rotates the wafer W held on the holding unit 31.

The holding unit 31 and the rotating shaft 303 are formed with a gas flow path 305, of which one end side is opened to the top surface of the holding unit 31 and the other end side is connected to a vacuum pump (not illustrated) and a nitrogen gas supply unit (not illustrated) to be switchable therebetween. The holding unit 31 is configured as a vacuum chuck that sucks and holds the wafer on the top surface of the holding unit 31 by vacuum evacuating the inside of the gas flow path 305 by the vacuum pump when a processing of the wafer W is performed.

The top plate 32 is a disc-shaped member configured to cover the top surface of the peripheral edge side of the wafer W held by the wafer holding mechanism 30, and is formed with an opening 321 in the center portion thereof.

Figure 3:
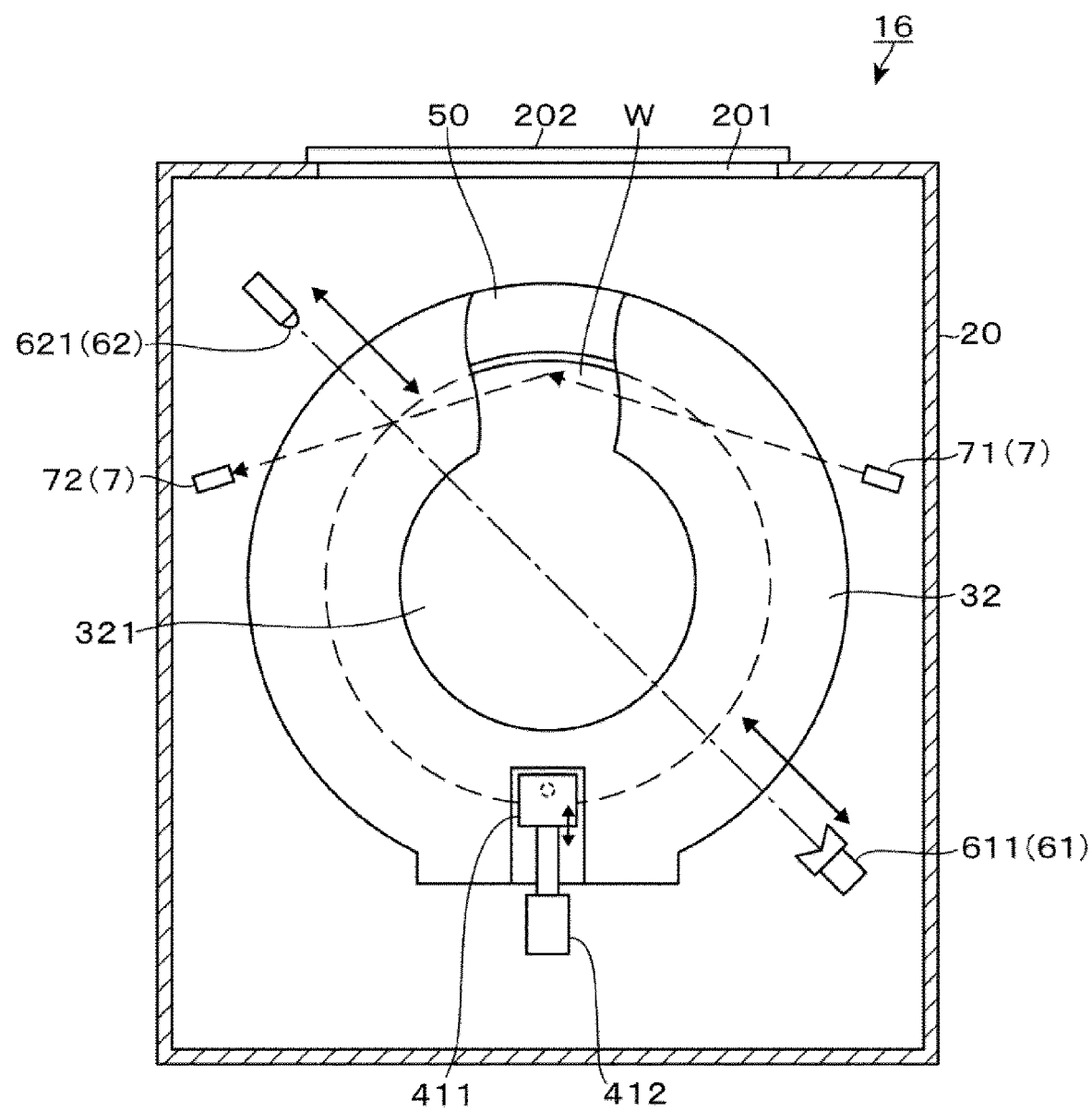
FIG. 3 is a horizontal sectional plan view of the processing unit.

As illustrated in FIGS. 2 and 3, a portion of the outer periphery of the disc-shaped top plate 32 is cut out to form a notch, and the first nozzle unit 411 is disposed in the notch to supply a processing liquid to the peripheral edge of the wafer W from the top side thereof. The first nozzle unit 411 may downwardly eject, for example, a processing liquid for removing the film on the peripheral edge of the wafer W and de-ionized water (DIW) serving as a rinse liquid for rinse cleaning, in a switching manner.

The processing liquid supplied from the first nozzle unit 411 may be, for example, a solvent or a developing solution for removing a resist film, and an acidic chemical liquid (e.g., dilute hydrofluoric acid), or an alkaline chemical liquid (e.g., ammonia) for removing a metal film, an oxide film, or an inorganic film.

From the viewpoint of ejecting the processing liquid that performs the film removal, the first nozzle unit 411 corresponds to an ejection unit of the present example. At the upstream side of the first nozzle unit 411, a processing liquid supply unit (not illustrated) configured as a supply source of the processing liquid or a flow rate adjustment mechanism of the processing liquid, is provided.

The first nozzle unit 411 is provided with a movement mechanism 412 that includes a rod or a cylinder motor configured to move the first nozzle unit 411 toward the diametric direction of the top plate 32, i.e. the diametric direction of the wafer W. The movement mechanism 412 moves the first nozzle unit 411 based on an instruction from the controller 18.

As illustrated in FIG. 2, the cup unit 50 is an annular member disposed to surround the periphery of the wafer W held by the wafer holding mechanism 30. The cup unit 50 includes a groove 51 formed along the inner peripheral surface thereof so as to receive a processing liquid scattered from the wafer W. A drain pipe (not illustrated) and an exhaust pipe (not illustrated) are connected to the groove 51 so as to discharge the processing liquid received by the cup unit 50 or gas introduced through the opening 321 to the outside.

A notch is formed in an area inside the groove 51 of the cup unit 50 to dispose therein the second nozzle unit 421 configured to supply a processing liquid to the peripheral edge of the wafer W from the bottom side. In consideration of the facts that the processing liquid and the rinse liquid for removing the film formed to wrap around the bottom surface of the wafer W is capable of being supplied in a switching manner, and that the ejection position of the processing liquid is adjustable by moving the arrangement position of the second nozzle unit 421 in the diametric direction using a movement mechanism 422, the second nozzle unit 421 has the same function as the above-described first nozzle unit 411.

The above-described top plate 32 (including the first nozzle unit 411 and the movement mechanism 412 (the same is applied to the following description of an elevating operation of the top plate 32)) and the above-described cup unit 50 (including the second nozzle unit 421 and the movement mechanism 422 (the same is applied to the following description of an elevating operation of the cup unit 50)) include an elevating mechanism (not illustrated). When placing the wafer W on the wafer holding mechanism 30, the top plate 32 is retracted upward and the cup unit 50 is retracted downward. In addition, when performing a processing of the peripheral edge, the members 32 and 50 move from the retracted positions thereof to a processing position so as to overlap each other in the vertical direction, thereby forming a processing space to perform a processing of the wafer W therein. Meanwhile, FIG. 2 illustrates the state where the top plate 32 and the cup unit 50 are moved to the processing position.

Further, the processing unit 16 includes a positioning mechanism configured to perform centering to cause the rotation center of the holding unit 31 and the center of the wafer W to coincide with each other. The positioning mechanism includes a first positioning mechanism unit 61 provided with a first positioning member 61 that is abutted on the side peripheral surface of the wafer W, and a second positioning mechanism unit 62 provided with a second positioning member 621 that is abutted on the side peripheral surface of the wafer W.

Further, as illustrated in FIG. 2, the first positioning member 611 is connected to a first drive unit 614 via a support unit 612 configured to be movable on a rail 613. In the same manner, the second positioning member 621 is connected to a second drive unit 624 via a support unit 622 configured to be movable on a rail 623.

With the arrangement of the above-described components, it is possible to make the center of the wafer W coincide with the rotation center by bringing the first positioning member 611 and the second positioning member 612 into contact with the side peripheral surface of the wafer W such that the wafer W is interposed therebetween.

The top plate 32, the cup unit 50, the first and second nozzle units 411 and 421 and the movement mechanisms 412 and 422 thereof, and the positioning mechanisms (the first positioning mechanism unit 61 and the second positioning mechanism unit 62) described above are disposed in a common chamber 20 (FIG. 3). The chamber 20 is formed with a carry-in/out port 201, which may be opened or closed by a shutter 202. The substrate transfer device 17 in the transfer section 15 enters the chamber 20 through the carry-in/out port 201, and performs the delivery of the wafer W between the substrate transfer device 17 and the holding unit 31.

Figure 4:
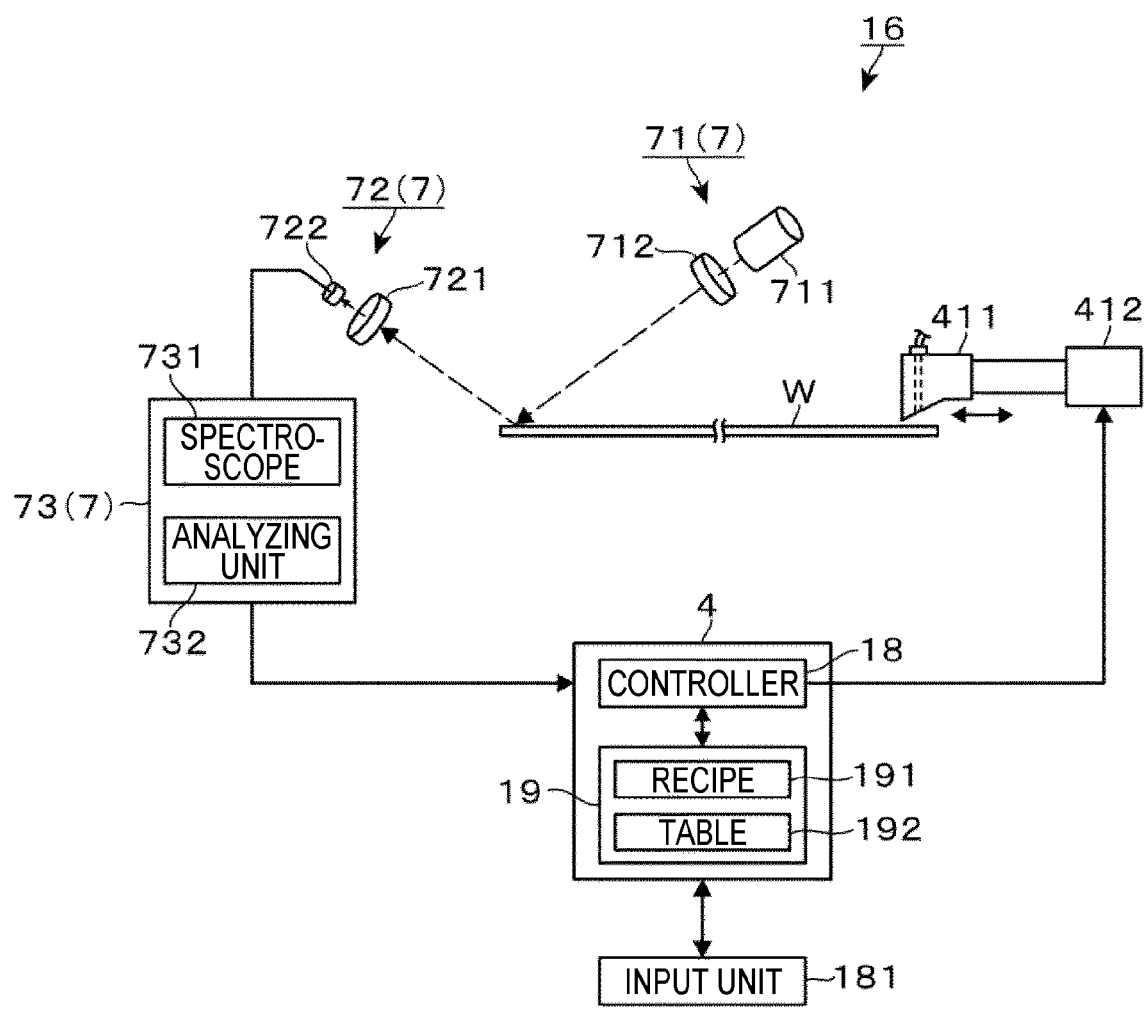
FIG. 4 is a block diagram of the processing unit.

Further, the control device 4 of the substrate processing system described above based on FIG. 1 also functions as the control device 4 of each processing unit 16 as schematically illustrated in FIG. 4. The control device 4 is connected to an input unit 181, which is constituted by, for example, a touch panel, and receives the setting of information related to a processing of the wafer W to be processed from an operator through the input unit 181.

Meanwhile, the input unit 181 is not limited to the case where it is constituted by the touch panel, which directly receives an input of processing parameters from the operator. For example, the input unit 181 may be a network communication unit, which acquires information of processing parameters from an external server of the substrate processing system 1 through a computer network in a semiconductor factory provided with the substrate processing system 1.

In the processing unit 16 of the present example, information related to a recipe, in which the operation sequence of a processing on the wafer W (in the present example, a processing of removing the film on the peripheral edge of the wafer W) and processing parameters are described, is set from the input unit 181.

The processing parameters of the recipe include a set value of the removal width of the film to be removed by the processing liquid, which is supplied from the first nozzle unit 411. For example, as the removal width, the dimension of the removal width, such as "1 mm," is set in the diametric direction from the outer peripheral end position of the wafer W. A recipe 191 including the set value of the removal width is registered in the storage unit 19 of the control device 4 (FIG. 4).

The controller 18 reads the recipe 191 from the storage unit 19, and performs, for example, the rotation of the wafer W by the wafer holding mechanism 30 or the switching of the liquids supplied from the first and second nozzle units 411 and 421 based on the operation sequence described in the recipe 191. At this time, for example, the control of the rotation number of the wafer W or the control of the flow rate of the liquid to be supplied to the wafer W is performed based on the processing parameters described in the input unit 181.

Further, with regard to the removal of the film on the peripheral edge of the wafer W, the controller 18 outputs information related to the movement destination of the first nozzle unit 411 relative to the movement mechanism 412 so as to move the first nozzle unit 411 to the position at which the removal width of the film becomes the set value (e.g. "1 mm") based on the set value of the removal width described in the recipe 191. For example, as illustrated in the first nozzle unit 411 of FIG. 2, in the case where the processing liquid is ejected vertically downward from an outlet of the processing liquid, which is formed in the bottom surface of the first nozzle unit 411, the movement destination of the first nozzle unit 411 is set so that the inner end position of the liquid application point where the processing liquid reaches the wafer W coincides with the inner end of the area from which the film is removed. A corresponding relationship between the removal width of the film, which is read from the recipe 191, and the ejection position at which the first nozzle unit 411 performs the ejection of the processing liquid is previously recognized by, for example, a preliminary text, and is previously registered in, for example, the storage unit 19 or a register in the controller 18.

From the above-described viewpoint, the controller 18 serves as an ejection position setting unit in the processing unit 16 of the present example.

The above-described processing unit 16 further includes a sensor unit 7, which is an analysis sensor for acquiring property information of a film to be removed by a processing liquid. The sensor unit 7 of the present example is configured as a spectroscopic ellipsometer, which specifies the film type of a removal target film. A spectroscopic ellipsometry (polarization analysis) is a known method of emitting polarized light to an analysis target object and detecting the property of the analysis target object based on a variation in the polarization state of the reflected light reflected from the analysis target object.

In a semiconductor device manufacturing process, the application of the spectroscopic ellipsometry to the film thickness measurement of, for example, a film formed on the surface of the wafer W is reviewed. On the contrary, the processing unit 16 of the present example is characterized in that the property information of the film, which is acquired from the sensor unit 7, is utilized as type information for identifying the type of a film to be removed by a processing liquid (various film constituent materials, such as an individual photoresist resin in the case of a resist film, $SiO_2$, or the like in the case of an oxide film or an inorganic film, or aluminum, copper or the like in the case of a metal film).

Hereinafter, a method of specifying the film type of a removal target object will be described based on the configuration of the sensor unit 7 and the property information acquired using the sensor unit 7 with reference to FIGS. 3 to 5.

As illustrated in FIGS. 3 and 4, the sensor unit 7 includes a light projecting unit 71 configured to introduce analysis light for analyzing the film type to the wafer W, and a light receiving unit 72 configured to receive the light reflected from the wafer W. The light projecting unit 71 includes a light source 711 configured to output, for example, white light including plural wavelength components, and a polarizer 712 configured to polarize the light output from the light source 711.

Further, the light receiving unit 72 includes a photoelastic modulator (PEM) 721 configured to modulate the phase of the received reflected light at a required frequency (e.g. 50 kHz) to obtain polarized lights from a linearly polarized light to an elliptically polarized light, and a detector 722 configured to detect the light phase-modulated by the PEM 721.

As illustrated in FIG. 3, the light projecting unit 71 and the light receiving unit 72 of the present example are disposed in the chamber 20 in which a processing of a wafer W is performed. Specifically, the light projecting unit 71 is disposed at the position to introduce the analysis light toward the peripheral edge of the wafer W, which is the area in which the removal of the film of the wafer W held on the holding unit 31 is performed in the state where the top plate 32 is raised. In addition, the light receiving unit 72 is disposed at the position to receive the analysis light reflected from the peripheral edge of the wafer W.

For example, in the plane of the wafer W, areas in which different films are exposed may be mixed. Thus, by irradiating the analysis light to the peripheral edge of the wafer W, which is the area in which the removal of the film is actually performed, the type of the film to be processed may be accurately specified.

Meanwhile, in FIG. 3 or FIG. 4, the optical path of the analysis light, which is output from the light projecting unit 71, reflected from the top side of the wafer W, and received by the light receiving unit 72, is schematically illustrated by long dash-line arrows. However, in these drawings, for example, the arrangement positions of the light projecting unit 71 and the light receiving unit 72, the light output direction, and the light receiving direction do not strictly indicate the actual arrangement in the processing unit 16.

Returning back to the description of the configuration of the sensor unit 7, as illustrated in FIG. 4, the output of the detector 722 is input to a spectroscope 731 in a sensor main body 73 through an optical fiber. The spectroscope 731 performs a measurement of the polarization degree for each wavelength. The spectroscope 731 converts the measured result into a digital signal, and outputs the digital signal to an analyzing unit 732. The analyzing unit 732 calculates the amplitude ratio ψ and the phase difference Δ for each wavelength, which indicate the polarization states (p-polarization and s-polarization) of the reflected light based on the digital signal acquired from the spectroscope 731. Then, from the amplitude ratio ψ and the phase difference Δ, inherent optical constants [a refractive index (n-value) and an attenuation coefficient (k-value)] of a constituent material of the film to be analyzed may be calculated (see, e.g., Japanese Patent Laid-Open Publication No. 2002-131136). The analyzing unit 732 also functions to calculate the n-value and the k-value from the amplitude ratio ψ and the phase difference Δ.

In the present example, the n-value and the k-value correspond to the property information of the film to be removed from the peripheral edge of the wafer W. Thus, the sensor unit 7 corresponds to a property information acquisition unit, which performs the acquisition of property information by the analysis of the film to be removed.

As illustrated in FIG. 4, the n-value and the k-value calculated by the analyzing unit 732, are output to the controller 18. The controller 18 registers the n-value and the k-value acquired from the sensor unit 7 in, for example, a register, and performs comparison with an n-value range and a k-value range, which are described in a film information table 192, which is previously registered in the storage unit 19.

Here, the n-value and the k-value acquired by the sensor unit 7 described above are inherent values of the constituent material of the film to be analyzed, and have a certain variation range according, for example, the film thickness or the surface roughness of the film. At this time, as illustrated as schematic images in FIG. 5, in the case where the variation ranges of the n-value and the k-value (an "n-value range" and a "k-value range") do not overlap between the film types, the n-value range and the k-value range may be utilized as type information for identifying the type of the film to be analyzed. Meanwhile, FIG. 5 does not illustrate the example of the n-value range and the k-value range of a film to be present later.

In the above-described film information table 192, for each film type, a set of a n-value range and a k-value range, which are determined based on the acquired results of the n-values and the k-values of the films formed on a plurality of wafers W by, for example, a preliminary test, is registered (see Table 1 described below).

In addition, in the film information table 192, a correction amount for correcting an ejection position of a processing liquid from the first nozzle unit 411, which is set based on the result of reading a set value of a removal width of a film from the recipe 191, is registered to correspond to a set of an n-value range and a k-value range (type information of a film type).

As described above, in the film formed on the wafer W, for example, the wettability of the film for a processing liquid or a time required for removing the film may vary depending on the film type. In this case, when the ejection position of the processing liquid from the first nozzle unit 411 is uniformly set based on the set value of the removal width read from the recipe 191, the removal width of the film, which is removed by supplying the processing liquid from the ejection position, may deviate from the set value of the recipe 191.

Thus, in the film information table 192, in order to make the actual removal width get closer to the set value of the removal width in the recipe 191, the correction amount for correcting the ejection position of the processing liquid from the first nozzle unit 411, which is set based on the set value of the removal width, is registered.

Figure 5:
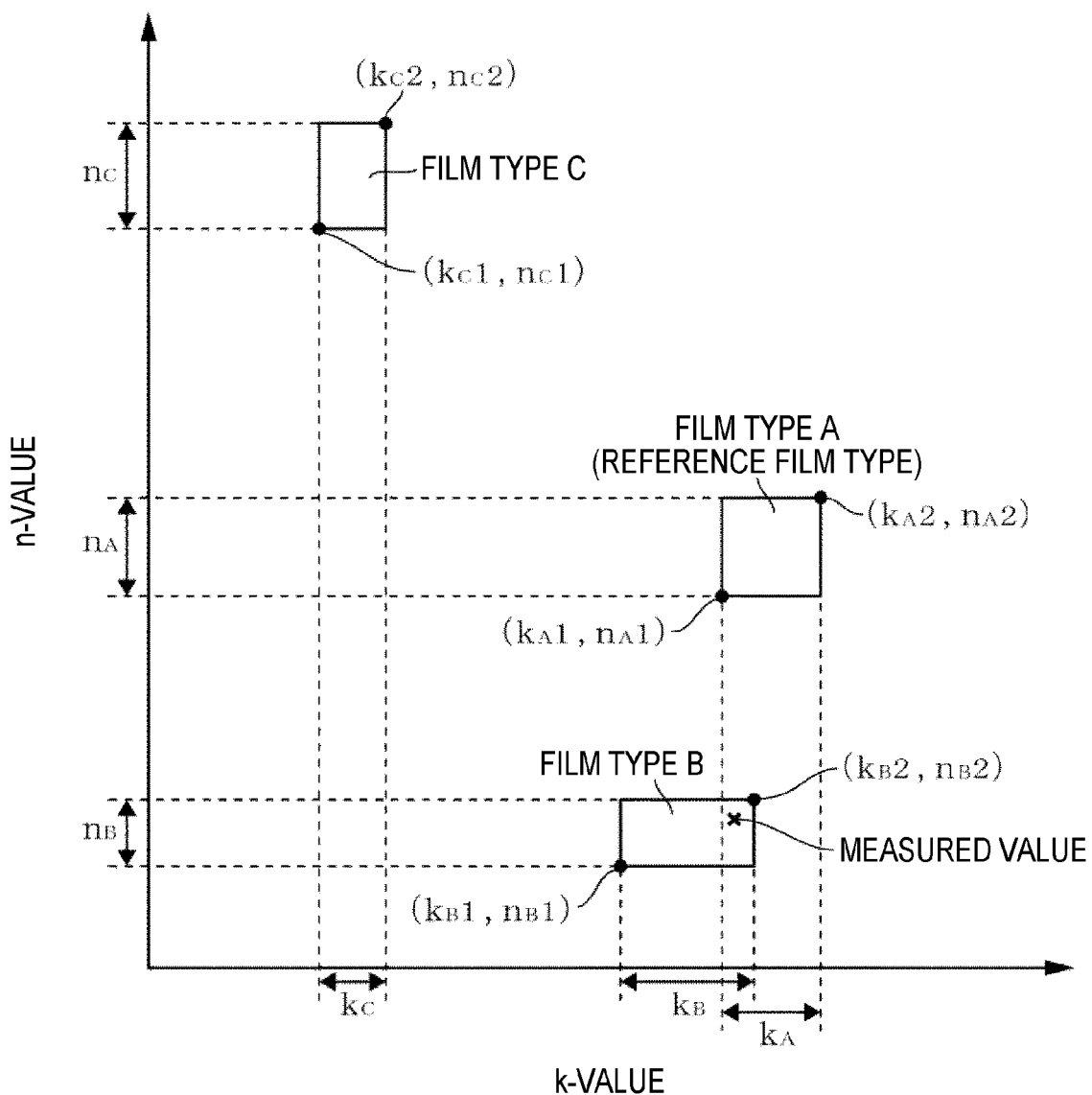
FIG. 5 is a view for explaining a method of specifying the type of a film based on the property information of the film.

For example, Table 1 illustrates a configuration example of the film information table 192, which summarizes the above-described n-value range, k-value range, and a correction amount of an ejection position, with respect to the film types A to C, which are described using FIG. 5.

TABLE 1

| Film type | n-value range | k-value range | Correction Amount [mm] |
|---|---|---|---|
| Film type A (reference film type) | $n_A1 \leq n_A \leq n_A2$ | $k_A1 \leq k_A \leq k_A2$ | 0.0 |
| Film type B | $n_B1 \leq n_B \leq n_B2$ | $k_B1 \leq k_B \leq k_B2$ | +0.1 |
| Film type C | $n_C1 \leq n_C \leq n_C2$ | $k_C1 \leq k_C \leq k_C2$ | −0.2 |

In Table 1, the film type A is assumed as a reference film type, which becomes the reference when the ejection position of the liquid ejected from the first nozzle unit 411 is determined with respect to the set value of the removal width of the film read from the recipe 191. At this time, the actual removal width is within a tolerance range (e.g., a set value ±10 μm), and the correction of the ejection position is not performed (the correction amount is "0.0 mm").

Next, in the film type B, as a result of performing a processing by moving the first nozzle unit 411 to the ejection position corresponding to the set value, it is assumed that the actual removal width becomes "0.9 mm" when the set value of the removal width is set to "1 mm" in the recipe 191, and in the same manner, it is assumed that the actual removal width becomes "1.0 mm" when the set value is set to "1.1 mm" In this case, the correction amount of the film type B is set to "+0.1 mm" (Table 1).

On the contrary to the above-described example, in the film type C, it is assumed that the actual removal width becomes "1.2 mm" when the set value of the removal width is set to "1 mm" in the recipe 191, and in the same manner, it is assumed that the actual removal width is "1.0 mm" when the set value is set to "0.8 mm" In this case, the correction amount of the film type C is set to "−0.2 mm" (Table 1).

Meanwhile, the examples of the above-described film types B and C indicate setting examples of the correction amount in the case where there is a direct proportional relationship between the movement distance of the ejection position and the removal width (when the ejection position of the processing liquid is moved by "+0.1 mm," the removal width also changes by "+0.1 mm"). In this regard, the correction amount may be appropriately adjusted according to an actual response relationship between the movement distance of the ejection position and the removal width.

Further, for the convenience of description, in Table 1, the n-value range and the k-value range are described with the correction amount of the ejection position of the processing liquid from the first nozzle unit 411 to correspond to the marks of the film types (the film types A, B and C). However, it is not necessary to set information, which indicates the film types, in the film information table 192. As illustrated in FIG. 5, in the case where the n-value range and the k-value range do not overlap each other between the film types, the n-value range and the k-value range themselves correspond to information indicating the film types.

When the n-value and the k-value of the film to be processed are acquired from the sensor unit 7, the controller 18 compares whether or not the n-value and the k-value are included in any one set of the n-value range and the k-value range, which are set in the film information table 192. In addition, when the corresponding set of the n-value range and the k-value range is present, the controller 18 reads the correction amount corresponding to the set. In this regard, the controller 18 serves as a correction amount acquisition unit.

In addition, the controller 18 performs the correction of the ejection position of the processing liquid from the first nozzle unit 411, which is set based on the set value of the removal width in the recipe 191, prior to the actual movement of the first nozzle unit 411 by the movement mechanism 412. Here, the correction of changing the ejection position is performed so as to move the first nozzle unit 411 by the distance corresponding to the correction amount, which is read from the film information table 192. Here, the controller 18 serves as an ejection position correction unit. In addition, the controller 18 outputs information related to the movement destination of the first nozzle unit 411 relative to the movement mechanism 412 based on the corrected ejection position. As a result, with regard to the wafer W, the ejection of the processing liquid is performed from the position (hereinafter, referred to as an "ejection execution position") acquired by correcting the ejection position, which is set based on the recipe 191, with the correction amount, which is determined based on the specific result of the film type by the sensor unit 7.

Hereinafter, an operation of the processing unit 16 having the above-described configuration will be described with reference to FIG. 6.

Figure 6:
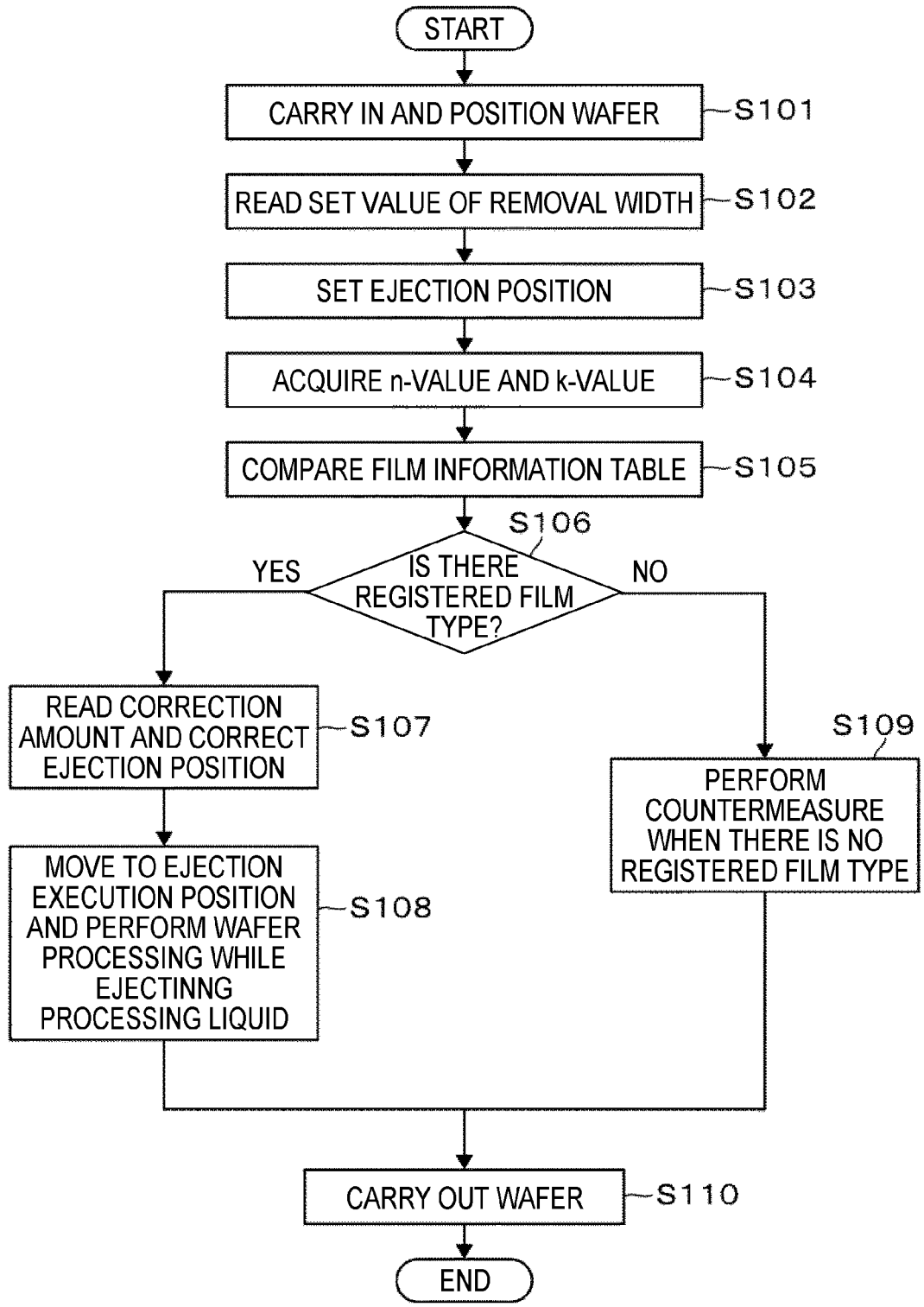
FIG. 6 is a flowchart illustrating the flow of an operation of using the property information of a film in the processing unit.

First, the wafer W is carried into the chamber 20 of the processing unit 16, in which a processing is performed, by the substrate transfer device 17 (start, step S101 in FIG. 6). At this time, the processing unit 16 stands by in the state where the top plate 32 and the cup unit 50 are retracted upward and downward, respectively. The substrate transfer device 17 introduced into the chamber 20 delivers the wafer W to the holding unit 31, and thereafter retracts from the inside of the chamber 20.

Once the wafer W is transferred to the holding unit 31, centering is performed by operating the positioning mechanisms (the first positioning mechanism unit 61 and the second positioning mechanism unit 62) such that the wafer W is interposed between the first and second positioning members 611 and 612 (step S101). At this time, the accurate end positions of the wafer W may be specified in consideration of a tolerance during the manufacture thereof by measuring the diameter of the wafer W based on the distance between the first and second positioning members 611 and 621, which come into contact with the wafer W.

Meanwhile, the controller 18 reads the set value of the removal width of the film from the recipe 191, which is set for the wafer W inside the carrier C, prior to starting the processing of the wafer W in the carrier C by the substrate processing system 1 (step S102). In addition, the provisional ejection position of the processing liquid, which corresponds to the set value of the removal width and is to be output for the movement mechanism 412 of the first nozzle unit 411, is registered in a register inside the controller 18 (step S103, an ejection position setting process).

In addition, once the centering is completed, the n-value and the k-value are acquired by performing the spectroscopic ellipsometry of the film formed on the peripheral edge using the sensor unit 7 in the state where the top plate 32 is being retracted upward with respect to the wafer W held on the holding unit 31 (step S104, a property information acquisition process). At this time, for example, plural sets of n-values and k-values may be acquired by performing spectroscopic ellipsometry on plural regions of the peripheral edge of the wafer W while rotating the wafer W by a predetermined angle.

Once the analysis of the film is completed, the top plate 32 and the cup unit 50 are lowered and raised respectively to the processing position so as to form a processing space after the first and second positioning mechanism units 61 and 62 are retracted. At this time, the first and second nozzle units 411 and 421 are being retracted to the positions outside the wafer W.

Meanwhile, the n-values and the k-values acquired by spectroscopic ellipsometry are compared with the n-value range and the k-value range, which are registered in the film information table 192 (step S105). When the plural sets of the n-values and the k-values are acquired, the comparison may be performed either on average values of the n-values and the k-values of these sets may be performed, or on the n-values and the k-values of the respective sets.

As the result of comparison, when it is determined that the film type corresponding to the film formed on the wafer W to be processed is registered in the film information table 192 (step S106; YES), the correction amount of the corresponding film type is read from the film information table 192 (a correction amount acquisition process), and the correction of the ejection position (an ejection position correction process) is performed by reflecting the correction amount on the provisional ejection position registered in the register of the controller 18 (step S107). As a result, an ejection execution position is set, at which the ejection of the processing liquid is performed on the wafer W.

Here, as described above, in the case where a comparison is performed for each of the acquired plural sets of the n-value and the k-value, it may be determined that the film formed on the wafer W corresponds to the film type registered in the film information table 192 only when all the n-values and k-values correspond to the values within the registered n-value range and k-value range. In addition, a threshold value may be provided for the above determination, and it may be determined that the film corresponds to a registered film type when the number of sets corresponding to the values within the registered n-value range and k-value range is equal to or larger than the number of threshold values.

Returning back to the description of the operation of the processing unit 16, when the processing space is formed by the top plate 32 and the cup unit 50 and the ejection execution position is determined, the processing unit 16 rotates the wafer W held by the holding unit 31. When the rotation number of the wafer W reaches a preset value, the first and second nozzle units 411 and 421 are moved toward the wafer W while the ejection of the processing liquid is performed. At this time, the first nozzle unit 411 moves to the ejection execution position, which is set to correspond to the film type of the film formed on the wafer W (step S108, an ejection unit moving process and a removal process). On the other hand, the second nozzle unit 421 may move to the ejection position, which is set based on the film information table 192, or the ejection position may be preset to be fixed with respect to the movement mechanism 422, and then the second nozzle unit 421 may move to the ejection position.

In this way, once the first and second nozzle units 411 and 421 reach the predetermined positions, the removal of the film on the peripheral edge of the wafer W is performed by supplying the processing liquid to the peripheral edge from the top and bottom sides of the wafer W for a preset time (a removal process).

Thereafter, the liquid to be supplied from the first and second nozzle units 411 and 421 is switched to a rinse liquid, and the rinse cleaning is performed on the peripheral edge. Once the rinse processing is performed for a predetermined time, the supply of DIW stops and the rotation of the wafer W is continued to perform the spraying drying of DIW.

Once the shake-off drying is ended, the rotation of the wafer W stops and the top plate 32 and the cup unit 50 are retracted downward and upward, respectively, and the holding by the holding unit 31 is released. Then, the substrate transfer device 17 is introduced into the chamber 20 of the processing unit 16 such that the wafer W is delivered to the substrate transfer device 17, and the substrate transfer device 17 carries out the wafer W from the processing unit 16 (step S110, end).

Subsequently, a countermeasure in the case where the corresponding film type is not registered in the film information table 192 as a result of performing a comparison of the n-value and the k-value acquired with respect to the film formed on the wafer W will also be briefly described (step S106; NO). In this case, a preset "countermeasure performed where there is no registered film type" is performed (step S109).

As an example of the countermeasure, a processing of removing the film on the peripheral edge may be executed without performing a correction with respect to the provisional ejection position, which is registered to correspond to the set value of the removal width described in the recipe 191. In this case, for example, information indicating that a correction of the ejection position of the processing liquid is not being performed may be displayed on a display of the substrate processing system 1, or may be registered to correspond to, for example, the processing history of the wafer W.

In addition, as another example of the countermeasure, in the case where no registered film type is present, the processing of the wafer W by the processing unit 16 may not start, and information indicating the same may be issued as an alarm from, for example, the display of the substrate processing system 1. In this case, an instruction as to whether to continue the processing of the wafer W or to stop the processing of the wafer W may be received from the operator.

Once the countermeasure performed when there is no registered film type is completed, the wafer W is carried out from the processing unit 16 and the operation ends (step S110, end).

Here, in the case of the processing unit 16 provided in the substrate processing system 1 for mass production, which performs the same type of processing on a large amount of wafers W, the film types of the films formed on the wafers W are less likely to be changed from wafer W to wafer W. In this case, the operation illustrated in FIG. 6 may be performed on the first wafer W in the same carrier C or the same lot, and the processing of the remaining wafers W may be performed using the ejection execution position, which is determined during the processing of the first wafer. Further, at this time, the ejection execution position determined by a single processing unit 16 may be used by other processing units 16 provided in the same substrate processing system 1.

Meanwhile, in the substrate processing system 1 for evaluation in, which the contents of a processings performed on wafers W are frequently changed, the film formation may be performed on plural wafers W accommodated in one carrier C under different conditions, or the contents of the processing to be performed on the wafers W may be different from each other. In this case, the operation illustrated in FIG. 6 may be performed on each wafer W carried into the processing unit 16 so as to perform the determination of the ejection execution position.

With the processing unit 16 according to the present embodiment described above, the following effects can be obtained. The property information (the n-value and the k-value) of the film to be removed is acquired and used as type information for identifying the type (film type) of the film formed on the wafer W. Further, since the ejection position of the processing liquid for removing the film is corrected depending on the film type of the film formed on the wafer W, a variation in the removal width due to a difference in the film type can be reduced.

Here, conventionally, in the case where a deviation between the set value of the removal width described in the recipe 191 and the actual removal width is confirmed, an operator having the authority to change the set state of the device in the processing unit 16 may perform a manual adjustment, for example, by moving the origin position, which is used to grasp the movement amount of the first nozzle unit 411 by the movement mechanism 412, by the amount of deviation. Such a countermeasure may not only complicate the operation related to the adjustment, but also cause a mistake, such as forgetting to return the origin position, which have been changed at the time of switching the film type or the recipe 191, afterwards. Further, when preparing the recipe 191, a countermeasure to input the set value of the removal width by reflecting the amount of deviation may be considered. However, performing the management of the amount of deviation for each different film type and performing the change in the set value of the removal width in consideration of the amount of deviation with respect to all recipes 191 made according to a difference in processing conditions require a great deal of labor and are unrealistic.

In this regard, because the processing unit 16 of the present embodiment identifies the film type of the film formed on the wafer W to be processed by using the sensor unit 7, and automatically performs an operation of performing correction of the ejection position by using the film information table 192, which is previously registered in the storage unit 19, the processing unit 16 can improve the accuracy of the removal width without imposing a new burden on the operator.

Here, although an example of the first nozzle unit 411, which ejects the processing liquid vertically downward, is illustrated in FIGS. 2 and 4, the configuration of the first nozzle unit 411 is not limited thereto. For example, the processing liquid may be ejected obliquely downward. In this case, when viewing the wafer W in a plan view, the ejection position of the processing liquid from the first nozzle unit 411 and the liquid application point at which the processing liquid is supplied to the wafer W are arranged at horizontally deviated positions. Therefore, with respect to the ejection position or the correction amount, a setting may be made in consideration of the deviation.

In the above-described example, the correction of the ejection position of the first nozzle unit 411, which supplies the processing liquid to the top side of the wafer W, has been described. Because the pattern of a semiconductor device is formed on the top surface of the wafer W, for example, a strict management of the removal width in sub millimeter units is required. On the other hand, since the bottom surface of the wafer W is not a pattern formation surface and does not require the control of the removal width in many cases, an example of performing a correction using the sensor unit 7 with respect to the ejection position of the processing liquid from the second nozzle unit 421 is not illustrated. However, if necessary, the correction of the ejection position may also be performed with respect to the second nozzle unit 421, which supplies the processing liquid to the bottom side of the wafer W, by using the same method as the first nozzle unit 411 on the top side.

In addition, when a corresponding relationship between the removal width of the film and the ejection position of the first nozzle unit 411 is previously determined, it is not necessary to perform a preliminary test using the reference film type as in the example described using Table 1. After performing the determination of the ejection position based only on a relative positional relationship between the outer peripheral end of the wafer W held by the holding unit 31 and the first nozzle unit 411, the correction amount with respect to all film types (in the example of Table 1, film types A, B, and C) may be set based on, for example, the result of the preliminary test.

In addition, even with respect to the correction amount of the ejection position set in the film information table 192, it is not necessary to adopt a difference value [mm] between the ejection position of the processing liquid, which is set based on the recipe 191, and the actual ejection execution position. For example, a percentage relative to the ejection position may be adopted (for example, when the set value is 1 mm and the ejection execution position is 1.2 mm, the correction amount is "120%").

Next, a variation in a method of performing a correction of the ejection position after the correction amount depending on the film type is determined will be described. In the example illustrated in FIG. 6, registering the setting of the provisional ejection position in the register based on the set value of the removal width (step S103) and reflecting the correction amount corresponding to the film type of the wafer W on the setting in the register (step S107) are performed prior to the output of the setting information related to the movement mechanism 412.

On the other hand, for example, in step S103, the processing liquid ejection position, which is obtained based on the set value of the removal width, is output to the movement mechanism 412 so as to move the first nozzle unit 411, and subsequently, after the correction amount corresponding to the film type of the wafer W is read, the movement setting for only the width of the ejection position correction may be output to the movement mechanism 412 so as to move the first nozzle unit 411 again.

In addition, immediately after the wafer W is carried into the processing unit 16, the film type may be specified or the correction amount may be read, and the set value of the removal width of the film, which is set in the recipe 191 executed on the wafer W, may be rewritten to a value corrected by the correction amount. In this example, when the ejection position is determined based on the set value of the removal width after rewriting, the ejection position becomes the ejection execution position on which the correction amount is reflected.

Subsequently, as described above, the sensor unit 7, which adopts spectroscopic ellipsometry, may acquire two types of information (the n-value and the k-value) as the property information for identifying the film type. At this time, either one of the n-value or the k-value may be used to specify the film type. However, as illustrated in the "measured value" in FIG. 5, when it is difficult to distinguish the film type A from the film type B with the k-value alone, the film types may be identified by using both the n-value and the k-value.

In addition, the sensor unit 7, which acquires the property information, is not limited to the case where it is constituted by a spectroscopic ellipsometer. For example, a sensor unit 7, which adopts energy dispersive X-ray spectrometry (EDX) or X-ray photoelectron spectroscopy (PXP) as an analyzing method, may be used. In the analyzing methods, since a vacuum atmosphere is required, for example, a vacuum chamber may be connected to the outer wall of the carry-in/out station 2 of the substrate processing system 1, and the sensor unit 7 may be disposed in the vacuum chamber to acquire the property information.

In this case, the property information related to the correction of the ejection position of the first nozzle section 411 with respect to the plural processing units 16 provided in the substrate processing system 1 is acquired using the common sensor unit 7. From the property information acquired by using the common sensor unit 7, whether or not to correct the ejection position of the processing liquid in any of the processing units 16 is determined based on, for example, the transfer destination of the analyzed wafer W.

In addition, here, the method of sharing one sensor unit 7 by the plural processing units 16 may be applied not only to the case where EDX or PXP is adopted as an analysis method, but also to spectroscopic ellipsometry. For example, the common sensor unit 7, which is a spectroscopic ellipsometer, may be disposed on the transfer path of the wafer W in the transfer sections 12 and 15 of the substrate processing system 1, or the common sensor unit 7, which is a spectroscopic ellipsometer, may be provided in an orienter chamber (not illustrated), which is provided on the outer wall of the carry-in/out station 2 and accommodates an orienter, which adjusting the orientation of the wafer W.

In addition, it is not necessary to register in advance the correction amount of the ejection position of the processing liquid in the film information table 192. For example, a camera, which captures an image of the peripheral edge of the wafer W, may be provided in the processing unit 16, or on the transfer path of the wafer W in the transfer sections 12 and 15, and the correction amount of the processing liquid ejection position may be determined from a differential value between the actual value of the removal width measured based on the image capturing result and the set value of the removal width. After the correction amount is determined, the film information table 192 in which the correction amount is registered to correspond to the type information (property information, such as, for example, the n-value and the k-value) of the film formed on the wafer W may be newly prepared such that the film information table 192 can be used in the correction of the ejection position when the wafer W on which the same kind of film is formed is processed afterwards.

In addition to the above-described example, the setting item to be adjusted after the type of the film formed on the wafer W to be processed is specified is not limited to only the ejection position of the processing liquid. For example, the rotation number per unit time of the wafer W held by the wafer holding mechanism 30 or the supply flow rate of the processing liquid supplied from the first nozzle unit 411 may be corrected. The correction amounts (the rotation number correction amount and the correction flow rate) of these setting items, for example, as illustrated in Table 1, may be registered in the film information table 192 to correspond to the film property information (type information), such as, for example, the n-value and the k-value. As a result, these correction amounts may be read by the controller 18, and may be used to control the motor 302 of the rotation mechanism of the wafer holding mechanism 30 or the flow rate adjustment mechanism in the processing liquid supply unit on the upstream side of the first nozzle unit 411 (a rotation number per unit time correction process and a flow rate correction process).

Further, the method of acquiring the property information of the film formed on the wafer W to be processed does not necessarily have to acquire the property information from a result of actually analyzing the wafer W using the sensor unit 7. For example, the property information may be acquired together with the identification information of the wafer W to be processed from a server outside the substrate processing system 1 via a computer network in the semiconductor factory provided with the substrate processing system 1. In this case, the network communication unit, which performs the acquisition of the property information, constitutes the property information acquisition unit.

Further, it is not essential to use the property information acquired from the wafer W as the type information of the film. Describing an example of using the sensor unit 7 that is a spectroscopic ellipsometer, the above-mentioned k-value and n-value may be used as physical property information for specifying physical properties, such as, for example, the thickness of the film formed on the wafer W, the hardness of the film, and the surface roughness of the film.

Figure 7:
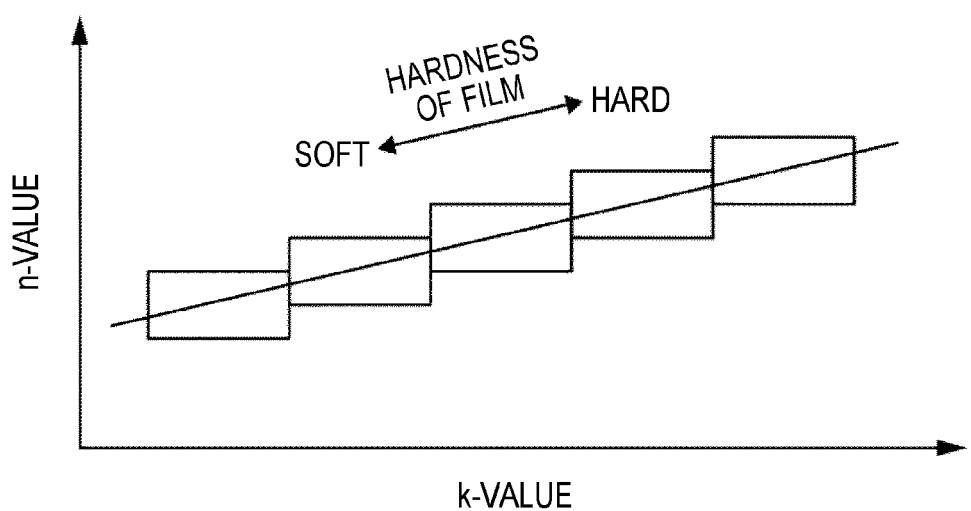
FIG. 7 is a view for explaining a method of specifying the hardness of a film based on the property information of the film.

For example, FIG. 7 schematically illustrates a relationship between the hardness of the film formed on the wafer W and the n-value and k-value. In this example of the film, the smaller the n-value and the k-value, the softer the film formed on the wafer W, and the larger the n-value and k-value, the harder the film. In addition, for example, the film thickness may be specified from a change in the n-value and the k-value.

Here, a hard film (thick film) may require the supply of the processing liquid for a longer time than the soft film (thin film). On the other hand, when the supply time (processing time) of the processing liquid becomes long, the inner peripheral end of the area from which the film is removed may be enlarged inward in the diametric direction of the wafer W. Therefore, when the actual processing time varies with respect to the preset reference processing time, the correction amount may be set so as to offset a variation in the removal width of the film due to variation in the processing time.

For example, when the correction amount (first correction amount) due to the difference in film type is determined based on the "reference processing time" described above, a control of the removal width with high accuracy may be performed by using the correction amount (second correction amount) due to a variation in the processing time. However, it may be not necessary to use both of these first and second correction amounts, and any one correction amount having a larger influence may be adopted.

Further, the rotation number per unit time of the wafer W and the supply flow rate of the processing liquid may of course be adjusted based on, for example, the thickness of the film or the hardness of the film obtained from the physical property information.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
a substrate holder configured to hold a substrate and including a rotation motor configured to rotate the substrate;
an ejector configured to eject a processing liquid to a peripheral edge of the substrate held by the substrate holder to remove a film on the peripheral edge of the substrate;
a controller configured to set an ejection position of the processing liquid to correspond to a removal width of the film included in an input recipe;
a motor configured to move the ejection position of the processing liquid from the ejector toward a diametric direction of the substrate based on the ejection position set by the controller; and
a property information acquisition circuit configured to acquire property information of the film to be removed, including a refractive index (n-value) and an attenuation coefficient (k-value),
wherein the controller, prior to an initial removal of the film, is configured to:
store a film information table including ranges for the refractive index (n-value) and the attenuation coefficient (k-value),
acquire a correction amount for correcting the ejection position based on the property information of the film acquired by the property information acquisition circuit prior to the initial removal of the film, and the film information table which is previously registered,
correct the ejection position based on the acquired correction amount, and
eject the processing liquid to the peripheral edge of the substrate held by the holder from the ejector positioned at the corrected ejection position to perform the initial removal of the film.

2. The apparatus of claim 1, wherein the property information of the film is type information of the film.

3. The apparatus of claim 1, wherein the property information of the film is physical property information of the film.

4. The apparatus of claim 3, wherein the physical property information of the film is a hardness or a film thickness of the film.

5. The apparatus of claim 1, wherein the controller acquires the property information via communication with an external device.

6. The apparatus of claim 1, wherein the property information acquisition circuit acquires the property information of the film to be removed via a sensor unit including a light source configured to direct light to the peripheral edge of the substrate and a detector configured to receive the light from the light source that is reflected from the peripheral edge of the substrate.

7. The apparatus of claim 6, wherein the sensor unit further includes a polarizer configured to polarize a light from the light source and a photoelastic modulator (PEM) to modulate a phase of the light polarized by the polarizer, wherein the controller acquires the property information based on a result of analyzing the film formed on the substrate by the sensor unit.

8. The apparatus of claim 6, wherein the substrate holder, the motor, and the sensor unit are disposed in a common chamber.

9. The apparatus of claim 6, wherein the controller acquires at least one of a rotation number correction amount for correcting a rotation number per unit time of the substrate rotated by the rotation motor, and a correction flow rate for correcting a supply flow rate of the processing liquid ejected from the ejector, depending on the property information of the film acquired by the sensor unit, and
wherein the rotation motor corrects the rotation number of the substrate based on the rotation number correction amount, and a processing liquid supply corrects the supply flow rate of the processing liquid based on the correction flow rate.

10. The apparatus of claim 1, wherein the correction amount to correct the ejection position corresponds to a predetermined range of the refraction index (n-value) and a predetermined range of the attenuation coefficient (k-value).

11. A liquid processing method comprising:
setting an ejection position of a processing liquid from an ejector, which is disposed opposite to a peripheral edge of a substrate, to correspond to a removal width of a film on the peripheral edge of the substrate, the ejection position being included in a recipe;
acquiring property information of the film to be removed, the property information including a refractive index (n-value) and an attenuation coefficient (k-value) prior to an initial removing of the film on the peripheral edge of the substrate;
acquiring a correction amount for correcting the ejection position set in the setting, based on the property information of the film acquired in the acquiring and a film information table which is previously registered prior to an initial removing of the film on the peripheral edge of the substrate;
correcting the ejection position set in the setting, based on the correction amount acquired in the acquiring prior to an initial removing of the film on the peripheral edge of the substrate;
moving the ejector to an ejection execution position corrected in the correcting; and
performing the initial removing of the film on the peripheral edge by supplying the processing liquid to the peripheral edge of the substrate that is being rotated by ejecting the processing liquid from the ejector moved to the ejection execution position wherein the film information table includes ranges for the refractive index (n-value) and the attenuation coefficient (k-value).

12. The method of claim 11, wherein the property information of the film is type information of the film.

13. The method of claim 11, wherein the property information of the film is physical property information of the film.

14. The method of claim 13, wherein the physical property information of the film is a hardness of the film or a film thickness.

15. The method of claim 11, wherein, in the acquiring, the property information is acquired based on a result of analyzing the film formed on the substrate by a sensor unit including a light source and a detector configured to receive light reflected off the wafer from the light source.

16. The method of claim 11, further comprising at least one of:
correcting a rotation number of the substrate in the removing; and
correcting a supply flow rate of the processing liquid ejected from the ejector in the removing, depending on the property information of the film acquired in the acquiring.

17. The method of claim 11, wherein the correction amount for the correcting corresponds to a predetermined range of the refraction index (n-value) and a predetermined range of the attenuation coefficient (k-value).

18. A non-transitory computer readable storage medium storing a computer program that, when executed, to cause a computer to control a substrate processing apparatus that removes a film on a peripheral edge of a substrate by supplying a processing liquid to the substrate,
    wherein the computer program includes a group of steps that are programmed to execute the liquid processing method of claim 11.

\* \* \* \* \*